United States Patent
Feilen et al.

(10) Patent No.: US 7,093,138 B2
(45) Date of Patent: * Aug. 15, 2006

(54) METHOD OF OPERATING A MICROCOMPUTER SYSTEM

(75) Inventors: Oliver Feilen, Rohrbach (DE); Norbert Loechel, Grafenau (DE); Juergen Pischke, Weissach (DE)

(73) Assignee: Robert Bosch GmbH, Stuttgart (DE)

( * ) Notice: Subject to any disclaimer, the term of this patent is extended or adjusted under 35 U.S.C. 154(b) by 712 days.

This patent is subject to a terminal disclaimer.

(21) Appl. No.: 10/187,692

(22) Filed: Jul. 1, 2002

(65) Prior Publication Data

US 2003/0018911 A1    Jan. 23, 2003

(30) Foreign Application Priority Data

Jul. 2, 2001    (DE) ................................ 101 31 574

(51) Int. Cl.
*G06F 11/30*    (2006.01)

(52) U.S. Cl. .................................... 713/193

(58) Field of Classification Search ............... None
See application file for complete search history.

(56) References Cited

U.S. PATENT DOCUMENTS

| | | | | |
|---|---|---|---|---|
| 6,032,257 A | * | 2/2000 | Olarig et al. | 726/35 |
| 6,178,509 B1 | * | 1/2001 | Nardone et al. | 726/22 |
| 6,466,048 B1 | * | 10/2002 | Goodman | 326/8 |
| 6,948,071 B1 | * | 9/2005 | Schneider et al. | 713/193 |

FOREIGN PATENT DOCUMENTS

| | | |
|---|---|---|
| DE | 197 23 332 | 9/1998 |
| WO | WO 00/75759 | 12/2000 |

* cited by examiner

*Primary Examiner*—Emmanuel L. Moise
*Assistant Examiner*—David Pearson
(74) *Attorney, Agent, or Firm*—Kenyon & Kenyon LLP

(57) ABSTRACT

A method of operating a microcomputer system in which at least part of a memory system of the microcomputer system is checked for manipulation of data stored in the memory system. Measures to prevent processing of the data in the microcomputer system are performed as a function of the result of the check, if the measures are activated. The measures are activated or deactivated as a function of the content of a read-only memory of the microcomputer system. To increase the effectiveness and reliability of a manipulation or tuning protection of the data, a code word is stored in the data, which is checked while the microcomputer system is in operation, and the measures are activated or deactivated as a function of the result of the check of the code word stored in the data.

19 Claims, 3 Drawing Sheets

METHOD OF OPERATING A MICROCOMPUTER SYSTEM

FIELD OF THE INVENTION

The present invention relates to a method of operating a microcomputer system. With this method, at least part of a memory system of the microcomputer system is checked for manipulation of data stored in the memory system. Depending on the result of the check, measures to prevent processing of the data in the microcomputer system are performed if the measures are activated. The measures are activated or deactivated depending on the content of a read-only memory of the microcomputer system.

The present invention also relates to a memory element for a microcomputer system, in particular for a control unit of a motor vehicle, in which a computer program is stored. The computer program is capable of executing on a computing element (or arithmetic unit) of the microcomputer system, in particular on a microprocessor. The memory element is made for example in the form of a read-only memory, a random access memory, or a flash memory.

The present invention further relates to a computer program which is capable of executing on a computing element, in particular on a microprocessor of a microcomputer system.

Finally, the present invention also relates to a microcomputer system including a memory system in which data, in particular a control program, parameters, or limit values are stored. The microcomputer system also includes a computing element, in particular a microprocessor, for processing the data. In addition, the microcomputer system includes checking arrangement to check the data for manipulation, blocking arrangement to prevent processing of the data depending on the result of the check, and first actuating arrangement to check the content of a read-only memory of the microcomputer system and to activate or deactivate the blocking arrangement depending on the content of the read-only memory.

BACKGROUND INFORMATION

A microcomputer system of other systems may be in the form of a motor vehicle control unit. The control unit is used to control and/or regulate functions or units of the motor vehicle, for example an internal combustion engine, an antilock brake system (ABS), an electronic steering system (steer-by-wire), an electronic braking system (brake-by-wire) or an automatic air conditioning system. The control unit includes a memory system in the form of a rewritable memory, in particular a flash memory. Data is stored in the flash memory in the form of a control program or in the form of parameters and limit values.

A defect in the controlled or regulated unit of the motor vehicle may occur due to a manipulation of the control program. Therefore, manipulation of the control program or the data is to be prevented as much as possible, but the manipulation is at least to be detectable afterwards, so that the cause of a defect of a controlled or regulated unit may be ascertained so that warranty claims may be assigned properly.

In spite of the risk of manipulation of the control program or the data by unauthorized persons, it is not advisable to forbid access to the memory system of the control unit completely. In order for example to perform reprogramming of the control unit, an authorized user group must be able to access the memory system. Specifically, it may be necessary from time to time to store a new version of a control program or new parameters or limit values in the control unit in order for example to remove errors in the software or to take new legal requirements into account.

The control unit of other prior systems include a checking arrangement to check at least a part of the data stored in the flash memory for manipulation. Different methods may be used from other systems for checking data stored in a memory system for manipulation, all of which may be employed in link with the exemplary embodiment and/or exemplary method of the present invention. In German Published Patent Application No. 197 23 332 is discussed a code word that may be formed, for example a checksum, for at least part of the memory system, and this code word may be compared with a reference code word which is stored in the flash memory. If the code word is not the same as the reference code word, it is inferred that the data has been manipulated.

The control unit of other systems may also include an activatable and deactivatable blocking arrangement to prevent the execution of the control program or the use of the parameters or limit values, if a manipulation of the data is recognized in the course of the check. The processing of the data is only prevented if the blocking arrangement is activated. To activate or deactivate the blocking arrangement, in the case of the control unit of other prior systems the content of a read-only memory of the control unit is checked. The read-only memory is in the form of an EEPROM (Electronically Erasable Programmable Read Only Memory), for example. The control unit includes first actuating arrangement, which activate or deactivate the blocking arrangement as a function of the content of the read-only memory. When the blocking arrangement is activated, in the event of a manipulation of the data, the processing of the data may be blocked either immediately or at a later point in time, for example at the next running cycle.

By default, the control units of the other systems may be delivered as so-called series devices, including an activated blocking arrangement, so that processing of the control program is blocked if a manipulation of the control program stored in the flash memory or of the parameters or limit values stored there is ascertained. However in certain situations, in particular during the development and testing phase of a control unit or control program, it is necessary to deactivate blocking of the processing of the data, so that various bits of data may be stored in the memory system rapidly and easily. A control unit including deactivated blocking arrangement is referred to as an application device.

According to other systems, in series devices at least one default value is stored in a predefinable memory area of the read-only memory. In application devices at least one of the default values is overwritten by a predefinable test pattern. The programming of this memory area occurs following production, before delivery of the control unit. The first actuating arrangement for checking the content of this memory area are implemented in the data, i.e. in the control program which is stored in the flash memory of the control unit. While the control program is executing, the content of the read-only memory is checked. If only default values are stored in the predefinable memory area of the read-only memory, the control unit is a series device and the blocking arrangement is activated. Thus if the checking arrangement recognizes a manipulation of the data stored in the flash memory, processing of the data is prevented. If at least one predefinable test pattern is stored in the predefinable memory area of the read-only memory, the control unit is an application device and the blocking arrangement are deactivated. Thus processing of the data is not prevented even if the checking resources recognize a manipulation of the control program, the parameters or limit values.

The content of the predefinable memory area of the read-only memory is also referred to as a hardware identifier, since the content of this memory area may not simply be changed. The default values and test patterns stored in the predefinable memory area of the read-only memory must be matched to the hardware environment and to the data stored in the flash memory. In the control unit referred to in other prior systems, the danger nevertheless exists that unauthorized third parties may circumvent a blockage of the processing of manipulated data by manipulating the predefinable memory area of the read-only memory so that a series device is thereby identified as an application device.

SUMMARY OF THE INVENTION

It is an object of the exemplary embodiment and/or exemplary method of the present invention to improve the manipulation or tuning protection of data stored in a memory system of a microcomputer system, in particular of increasing the effectiveness and reliability of the manipulation or tuning protection.

The exemplary embodiment and/or exemplary method of the present invention provides that a code word may be stored in the data which is checked while the microcomputer system is in operation, and that the measures may be activated or deactivated depending on the result of the check of the code word stored in the data.

In the exemplary embodiment and/or exemplary method of the present invention, in addition to the hardware identifier of other systems, a software is provided, which is checked along with the hardware identifier during the processing of the data stored in the memory system. The measures to prevent processing of the data if a manipulation of the data stored in the memory system is recognized are activated or deactivated depending on the result of the check of the hardware recognition key and the result of the software recognition key. Besides application devices and series devices, a distinction is also made between application data and series data. The measures to prevent processing of the data are activated when a series device has been recognized, when series data has been recognized, or when a series device and series data have been recognized. Hence the measures are only deactivated when application data is executing on an application device.

Whether the data is to be intended for the application case or for the series case is already specified in conjunction with the creation of the data. Depending on that specification, a predefinable code word is stored in a particular area of the data. The code word stored in the data may be determined in a particular manner, so that it may not simply be read out and manipulated by unauthorized third parties in order to identify the data as application data. If the data includes a control program, for example, there is also a second actuating arrangement provided in the control program to check the code word. Thus the control program checks itself, as it were, and ascertains whether it is identified as a control program for the application case or for the series case. Manipulation of the hardware identifier alone is no longer sufficient under the present invention to deactivate the measures to prevent processing of the data.

According to an exemplary embodiment of the present invention, the measures may be activated if a predefinable test pattern is not stored in a predefinable memory area of the read-only memory. A microcomputer system may be identified as a series device including activated measures for preventing processing of the data, by having no test pattern stored in the predefinable memory area of the read-only memory. In the case of application devices, on the other hand, the predefinable test pattern is stored in the read-only memory.

According to an exemplary embodiment of the present invention, the measures may be activated if a code word is stored in the data. To identify application data, one or more default values are stored in a predefinable area of the data. To identify series data, at least one of these default values is replaced by a code word. The code word may be a checksum, for example. For security reasons, the measures to prevent processing of the data are activated in this case.

Manipulation of the data is inferred if the code word does not correspond to a reference code word determined on the basis of the data with the aid of a predefinable encryption algorithm. By comparing the code word with the predefinable reference code word, the data stored in the memory system may be checked additionally for manipulation. The reference code word is determined prior to the processing of the data and stored in the memory system or in another memory of the microcomputer system. Lack of agreement of the code word with the reference code word means that either the data stored in the memory system or the code word stored in the data has been manipulated. One measure for when a manipulation is recognized, involves blocking the processing of the data.

The code word is dependent on at least part of the data stored in the memory system. The code word is formed and checked on the basis of an asymmetric encryption method.

According to an exemplary embodiment of the present invention, at least part of the data may be reduced on the basis of a compression algorithm to a fingerprint, which is encrypted to a signature with the aid of a private key accessible to only a limited group of individuals, and the signature is stored in the data as the code word. This measure results in additional security against manipulation of the software identifier.

According to another exemplary embodiment of the present invention, the signature may be decrypted with the aid of a freely accessible public key to produce a decrypted fingerprint, that from the same part of the data and on the basis of the same compression algorithm as in the formation of the signature a reference fingerprint be formed, and that the decrypted fingerprint be compared with the reference fingerprint. Manipulated data is inferred if the decrypted fingerprint is not the same as the reference fingerprint.

The exemplary method according to the present invention may be implemented in the form of a memory element which is intended for a microcomputer system, in particular for a control unit of a motor vehicle. In this case a computer program is stored on the memory element which is capable of executing on a computing element of the microcomputer system, in particular on a microprocessor, and which is suitable for performing the exemplary method according to the present invention. Hence the present invention is implemented in this case using a computer program stored in the memory element, so that this memory element provided with the computer program represents the present invention in the same manner as the method which the computer program is suitable for performing. As a memory element in particular an electrical memory medium may be used, for example a read-only memory, a random access memory or a flash memory.

The exemplary embodiment and/or exemplary method of the present invention also relates to a computer program that is suitable for performing the exemplary method according to the present invention when it executes on the computing element. The computer program is stored in a memory element, in particular in a flash memory.

The exemplary embodiment and/or exemplary method of the present invention also provides, on the basis of the microcomputer system, that a code word be stored in the data and that the microcomputer system include second actuating arrangement to check the code word during processing of the data and to activate or deactivate the blocking arrangement depending on the code word.

While the first actuating arrangement is intended for checking the hardware identifier, the second actuating arrangement is used to check the software identifier provided according to the present invention. If one of the two actuating arrangements, or else both actuating arrangements, indicate activation of the blocking arrangement, the measures to prevent processing of the data are activated. Then as soon as a manipulation of the data stored in the memory system is recognized, the processing of this data is prevented. The processing of the data may be blocked either immediately or only at a later point in time, for example at the next running cycle.

DETAILED DESCRIPTION

Figure 1:
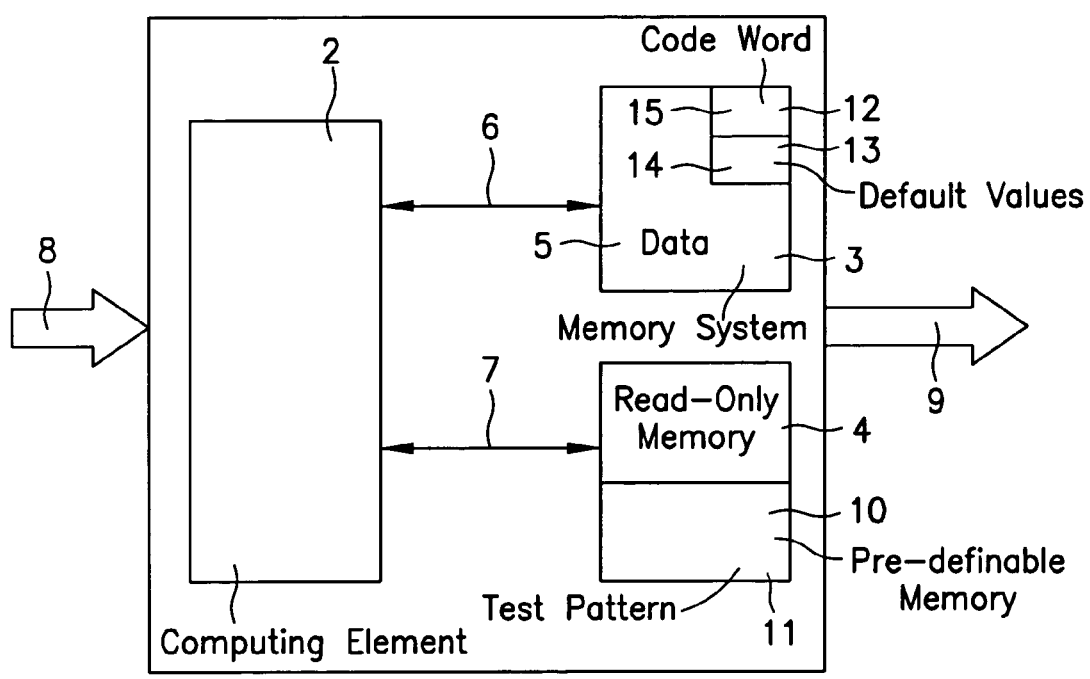
FIG. 1 shows an exemplary microcomputer system according to the present invention.

In FIG. 1 an exemplary microcomputer system according to the present invention is designated in its entirety with the reference symbol 1. Microcomputer system 1 is configured as a control unit for a motor vehicle. The control unit is used to control and/or regulate functions or units in a motor vehicle, for example an internal combustion engine, an antilock brake system (ABS), an electronic steering system (steer-by-wire), or an electronic braking system (brake-by-wire). Microcomputer system 1 includes a computing element 2 which is configured as a microprocessor. In addition, microcomputer system 1 includes a memory system 3 in the form of a rewritable memory, in particular a flash memory. Furthermore, microcomputer system 1 includes a read-only memory 4 in the form of an EEPROM (Electronically Erasable Programmable Read Only Memory).

In memory system 3 data 5 is stored, which may be processed by computing element 2 to implement the controlling or regulating function of control unit 1. Data 5 is in the form of a control program, of parameters or of limit values, for example. Between computing element 2 and memory system 3 there is a bi-directional data transmission link 6, through which data 5 which is to be processed may be transferred from memory system 3 to computing element 2, and also values to be stored in the memory system 3, such as the results of calculations, may be transferred from computing element 2 to memory system 3. In read-only memory 4 confidential data is stored, such as information about an immobilizer of a motor vehicle. This information may be transferred via a data transfer link 7 from read-only memory 4 to computing element 2.

Input signals 8 which provide microcomputer system 1 with information about the state of functions or units to be controlled or regulated are supplied to microcomputer system 1. Input signals 8 are registered for example by sensors or measurement pickups (not shown). In the course of working through the control program which is also stored in memory system 3, and while processing input signals 8 and the parameters or limit values stored in memory system 3, microcomputer system 1 generates output signals 9 which are supplied to the functions or units which are to be controlled or regulated. The state of functions or units that are to be controlled or regulated may be influenced via output signals 9.

In microcomputer system 1 there are checking arrangement for checking at least part of data 5 stored in memory system 3 for manipulation. If a manipulation of data 5 is recognized, the processing of data 5 in computing element 2 may be prevented by blocking arrangement. The processing of data 5 may be blocked immediately after the detection of a manipulation of data 5, or else not until a predefinable later point in time, for example at the next run cycle. The blocking arrangement may be activated and deactivated. In the case of a microcomputer system 1 identified as an application device, the blocking arrangement is deactivated. Application devices are used in particular in the development and testing phase of a motor vehicle control unit 1 or of the control program 5 stored in memory system 3. In the case of a microcomputer system 1 identified as a series device, on the other hand, the blocking arrangement is activated, so that when manipulated data 5 is detected, the processing of data 5 is blocked. The activated blocking arrangement in series devices are intended to prevent the microcomputer system 1 from being operated using manipulated data, or at least to enable verification of a manipulation of data 5.

To identify a microcomputer system 1 as an application device, a predefinable test pattern 11 is stored in a predefinable memory area 10 of read-only memory 4. During the processing of data 5 in computing element 2, that is, while the control program is executing, the content of memory area 10 of read-only memory 4 is checked. If predefinable test pattern 11 is stored in memory area 10, it is inferred that microcomputer system 1 is an application device and the blocking arrangement is deactivated. Otherwise it is inferred that microcomputer system 1 is a series device, and the blocking arrangement is activated. The check of content of memory area 10 of read-only memory 4 is performed by first actuating arrangement. The checking arrangement, the blocking arrangement and the first actuating arrangement for checking memory area 10 of read-only memory 4 are part of data 5, and are implemented in the control program which is capable of executing on computing element 2.

To improve the protection against manipulation of data 5 stored in memory system 3, along with the so-called hardware identifier (test pattern 11), a software identifier is provided, and the blocking arrangement is activated or deactivated depending on the hardware identifier and the software identifier. The content of predefinable areas 12 and 13 of data 5 is referred to as the software identifier. The software identifier may be used to identify data 5 as application data or as series data. In the case of application data, default values 14 are stored in areas 12, 13 of data 5. From the outside, default values 14, as part of control program 5 stored in memory system 3, may not be distinguished from the rest of control program 5 without knowing the memory addresses of areas 12, 13. In the case of series data, at least one of the default values 14 is replaced by a code word 15.

The check of the software identifier is performed by second actuating arrangement, which are also implemented in data 5 or in the control program.

According to the present program, the blocking arrangement for preventing the processing of data 5 are activated if test pattern 11 is not stored in predefinable memory area 10 of read-only memory 4, if code word 15 is stored in at least one of the areas 12, 13 of data 5, or if both conditions are true. In these cases the processing of data 5 is thus blocked if a manipulation of data 5 has been recognized. Only if none of the conditions are true are the blocking arrangement deactivated, so that during the development or testing phase of microcomputer system 1 or of data 5 any desired data may be stored in memory system 3 without blocking the processing of data 5. In other words, the blocking arrangement are only deactivated when application data is executing on an application device.

An additional aspect is that code word 15, which is stored in areas 12, 13 of data 5, is used to detect a manipulation of data 5. For this purpose, code word 15 is determined as a reference code word as a function of non-manipulated data 5 according to a predefinable encryption algorithm, before executing data 5. While data 5 is executed, another code word is determined depending on the data 5 stored in memory system 3, or part thereof; this code word is compared with the reference code word. If the determined code word is the same as the reference code word, data 5 is intact. Otherwise it is inferred that data 5 has been manipulated.

Figure 2:
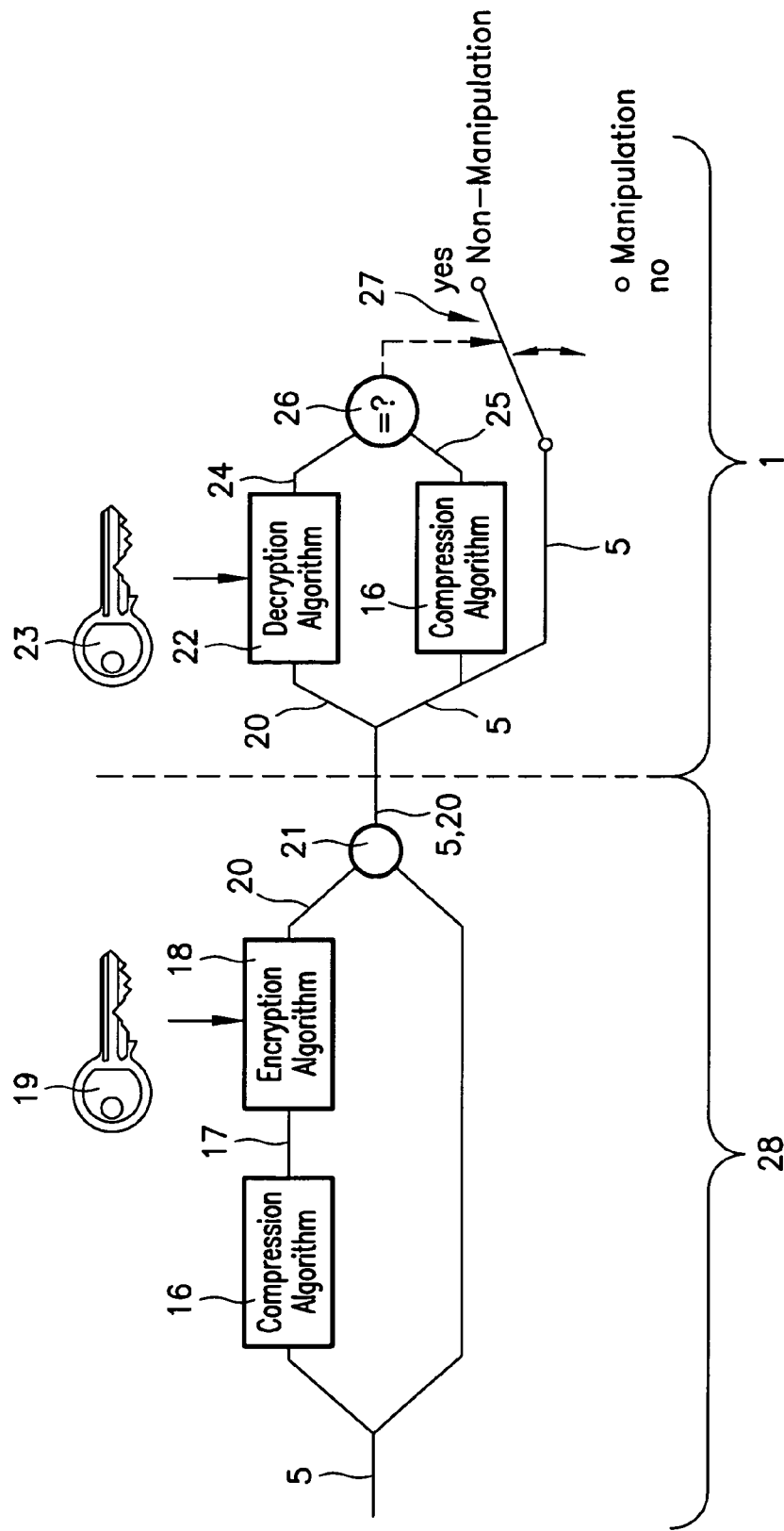
FIG. 2 shows a flow chart of an exemplary method according to the present invention for checking a software identifier.

FIG. 2 shows a flow chart of the part of the exemplary method according to the present invention which relates to the software identifier and the check of data 5 for manipulation. Data 5, which is to be stored in memory system 3 of microcomputer system 1 is reduced to a fingerprint 17 outside of microcomputer system 1, for example in a programming device or by the creator of data 5, at least in part on the basis of a compression algorithm 16. Fingerprint 17 is encrypted on the basis of an encryption algorithm 18 with the aid of a private key 19 which is accessible only to a limited group of individuals. The encrypted fingerprint is referred to as signature 20. In a function block 21 signature 20 is appended to data 5, it is stored in at least one of areas 12, 13 of data 5 as a code word. Then the data 5 with the signature 20 is transferred via a programming device for example to microcomputer system 1.

In microcomputer system 1, signature 20 is then decrypted to a decrypted fingerprint 24 on the basis of a decryption algorithm 22 and with the aid of a freely accessible public key 23. From the part of data 5 which was used to form signature 20 outside of microcomputer system 1, a reference fingerprint 25 is generated on the basis of the same compression algorithm 16. In a function block 26 a check is performed to determine whether decrypted fingerprint 24 is the same as reference fingerprint 25.

Depending on the result of the query performed in function block 26, a switch element 27 is triggered whereby data 5 is identified as manipulated or non-manipulated. If encrypted fingerprint 24 is the same as reference fingerprint 25, the check of signature 20 was successful and data 5 has not been manipulated, or no manipulation of data 5 was recognized. Otherwise data 5 is identified as manipulated. In this case for example the processing of data is blocked.

Figure 3:
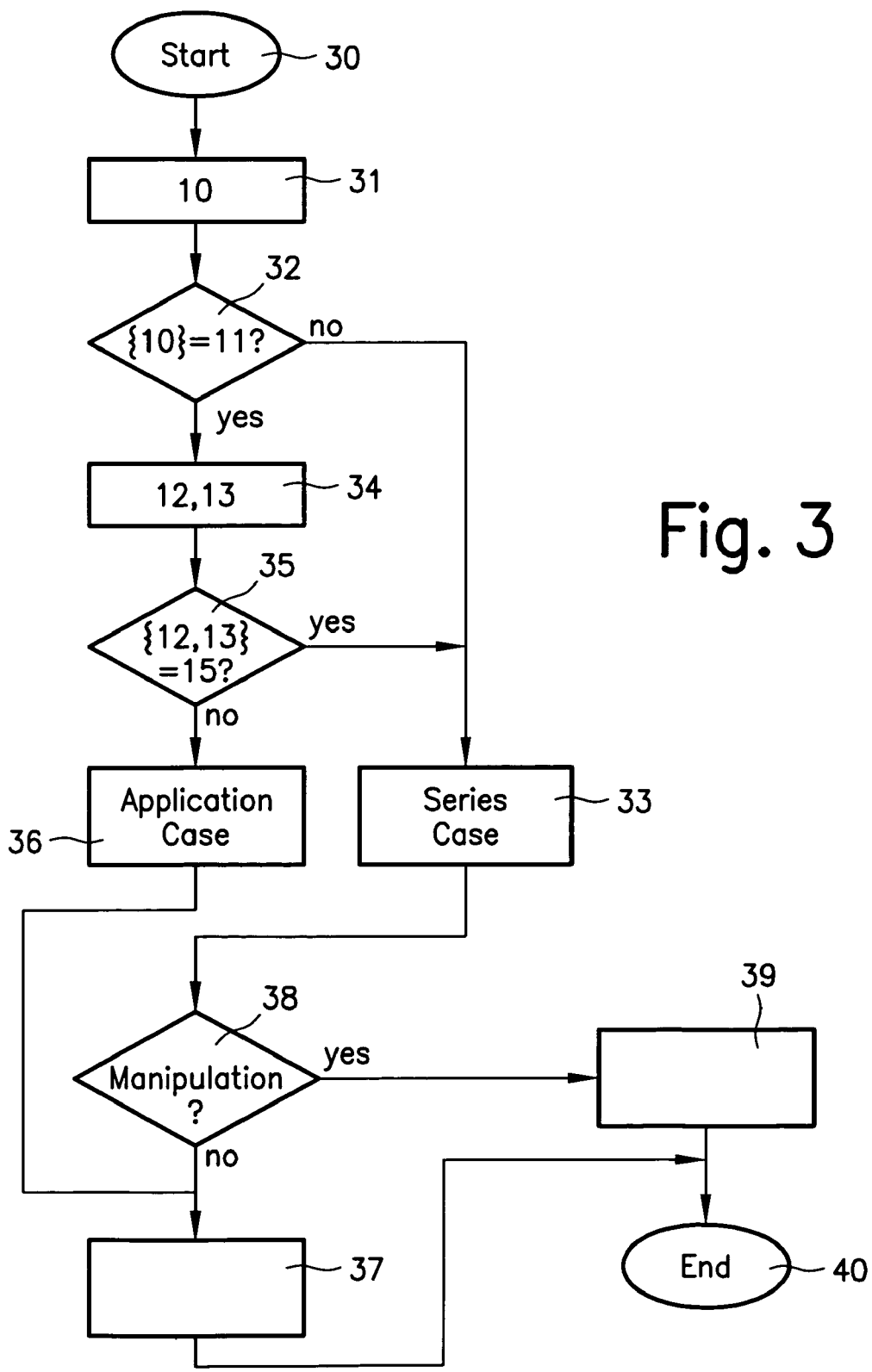
FIG. 3 shows another flow chart of the exemplary method according to the present invention.

FIG. 3 shows a flow chart of the entire exemplary method according to the present invention. The method begins in a function block 30. It is performed in conjunction with the processing of data 5, for example while a control program is executing. First the hardware identifier is checked. In a function block 31 the content of memory area 10 of read-only memory 4 is read in. In a query block 32 a check is then performed to determine whether the content of memory area 10 is the same as test pattern 11. If not (series case) the method branches off to a function block 33 in which the measures to prevent processing of data 5 are activated.

If the content of memory area 10 is the same as test pattern 11, the software identifier is checked. The method branches off to a function block 34 in which the content of areas 12, 13 of data 5 is read in. Next, in a query block 35 a check is performed to determine whether code word 15 is stored in areas 12, 13 of data 5. If so (series case) the method branches off to function block 33, in which the measures to prevent processing of data 5 are activated. If no code word 15 is stored in areas 12, 13 of data 5, that is, if only default values 14 are stored in areas 12, 13, the method branches off to a function block 36 in which the measures to prevent the processing of the data 5 are deactivated (application case).

In the application case data 5 may be processed entirely normally. The method therefore branches off from function block 36 to a function block 37, in which data 5 is processed, that is, the control program is performed entirely normally. In the series case, on the other hand, a check is performed to determine whether data 5 has been manipulated. The method therefore branches off from function block 33 to a query block 38, in which data 5 is checked for manipulation. To check a manipulation of data 5, a plurality of different methods are referred to other prior systems which may be used in link with the present invention.

Query blocks 35 and 38 may also be combined into a common query block in which the method shown in FIG. 2 is performed. If code word 15 is stored in at least one of areas 12, 13, this means that the present case is the series case. If in addition code word 15 does not match a reference code word, data 5 has been manipulated.

If a manipulation of data 5 is recognized in query block 38, the method branches off to a function block 39, in which the measures to prevent the processing of data 5 are activated. Then it branches off to a function block 40, and the method is terminated. If no manipulation of data 5 is recognized in query block 38, the method branches off to function block 37 and data 5 is processed entirely normally in function block 37.

What is claimed is:

1. A method for operating a microcomputer system, the system comprising:

checking at least part of a memory system of the microcomputer system for manipulation of data stored in the memory system;

performing, depending on a result of checking the at least part of the memory system, at least one measure, if the at least one measure is activated, to prevent processing of the data in the microcomputer system, the at least one measure being one of activated and deactivated as a function of a content of a read-only memory of the microcomputer system; and checking a code word stored in the data;

wherein the at least one measure is one of activated and deactivated depending on a result of checking the code word.

2. The method of claim 1, wherein the at least one measure is activated if a predefinable test pattern is not stored in a predefinable memory area of the read-only memory.

3. The method of claim 1, wherein the at least one measure is activated if the code word is stored in the data.

4. The method of claim 3, wherein manipulation of the data is detected if the code word does not correspond to a reference code word determined as a function of the data with aid from a specifiable encryption algorithm.

5. The method of claim 1, wherein the code word is a function of at least part of the data stored in the memory system.

6. The method of claim 5, wherein the code word is formed and checked based on an asymmetric encrypting method.

7. The method of claim 6, wherein the at least part of the data is reduced, based on a compression algorithm, to a fingerprint that is encrypted to a signature with aid from a private key accessible only to a limited group of individuals, and the signature is stored as the code word in the data.

8. The method of claim 7, wherein the signature is decrypted with aid from a freely accessible public key to a decrypted fingerprint, a reference fingerprint is formed from the at least part of the data and based on the compression algorithm, and the decrypted fingerprint is compared to the reference fingerprint.

9. The method of claim 8, wherein manipulation of the data is detected if the decrypted fingerprint is not the same as the reference fingerprint.

10. A memory element for a microcomputer system, comprising:
    a computer program executable by a computer of the microcomputer system, the computer program comprising program code for operating the microcomputer system by performing the steps of:
        checking at least part of a memory system of the microcomputer system for manipulation of data stored in the memory system;
        performing, depending on a result of checking the at least part of the memory system, at least one measure, if the at least one measure is activated, to prevent processing of the data in the microcomputer system, the at least one measure being one of activated and deactivated as a function of a content of a read-only memory of the microcomputer system; and
        checking a code word stored in the data;
        wherein the at least one measure is one of activated and deactivated depending on a result of checking the code word.

11. The memory element of claim 10, wherein the computer includes a microprocessor.

12. The memory element of claim 10, wherein the memory element includes one of a read-only memory, a random access memory and a flash memory.

13. The memory element of claim 10, wherein the memory element is arranged in a control unit of a motor vehicle.

14. A computer program stored at a memory and executable by a computer of a microcomputer system, the computer program comprising program code for operating the microcomputer system by performing the steps of:
    checking at least part of a memory system of the microcomputer system for manipulation of a data stored in the memory system;
    performing, depending on a result of checking the at least part of the memory system, at least one measure, if the at least one measure is activated, to prevent processing of the data in the microcomputer system, the at least one measure being one of activated and deactivated as a function of a content of a read-only memory of the microcomputer system; and
    checking a code word stored in the data;
    wherein the at least one measure is also one of activated and deactivated depending on a result of checking the code word.

15. The computer program of claim 14, wherein the computer includes a microprocessor.

16. The computer program of claim 14, wherein the memory includes a flash memory.

17. A microcomputer system, comprising:
    a memory system to store data including a code word;
    a computing element to process the data;
    a checking arrangement to check at least part of the data for manipulation;
    a blocking arrangement to prevent processing of the data as a function of a result of checking the at least part of the data;
    a read-only memory;
    a first actuating arrangement to check a content of the read-only memory and to one of activate and deactivate the blocking arrangement as a function of the content of the read-only memory; and
    a second actuating arrangement to check the code word during processing of the data and to one of activate and deactivate the blocking arrangement as a function of the code word.

18. The microcomputer system of claim 17, wherein the data includes at least one of a control program, at least one parameter and at least one limit value.

19. The microcomputer system of claim 17, wherein the computing element includes a microprocessor.

* * * * *